(12) United States Patent
Ko (10) Patent No.: US 7,826,303 B2
(45) Date of Patent: Nov. 2, 2010

(54) DATA OUTPUT CIRCUIT HAVING SHARED DATA OUTPUT CONTROL UNIT

(75) Inventor: Bok Rim Ko, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 208 days.

(21) Appl. No.: 12/156,888

(22) Filed: Jun. 5, 2008

(65) Prior Publication Data
US 2009/0231948 A1 Sep. 17, 2009

(30) Foreign Application Priority Data
Mar. 17, 2008 (KR) ...................... 10-2008-0024578

(51) Int. Cl.
*G11C 8/00* (2006.01)
(52) U.S. Cl. ............................... 365/233.1; 365/189.05; 365/230.08
(58) Field of Classification Search ............... 365/233.1, 365/189.05, 230.08
See application file for complete search history.

(56) References Cited

U.S. PATENT DOCUMENTS

| 5,341,338 A | * | 8/1994 | Hashiguchi et al. ......... 365/206 |
| 2004/0141383 A1 | * | 7/2004 | Lee ............................ 365/194 |
| 2008/0062772 A1 | | 3/2008 | Ko | |

FOREIGN PATENT DOCUMENTS

| KR | 10-2002-0079502 A | 10/2002 |
| KR | 10-2006-0130927 A | 12/2006 |

* cited by examiner

*Primary Examiner*—Huan Hoang
(74) *Attorney, Agent, or Firm*—John P. White; Cooper & Dunham LLP (57) ABSTRACT

A data output circuit is provided which is capable of reducing a size and current consumption by commonly using a data output control unit for a plurality of data output units. The data output circuit includes a data output control unit for receiving an external clock signal and generate clock pulses having a pulse width, a first data output unit for outputting first data in synchronization with the clock pulse, and a second data output unit for outputting second data in synchronization with the clock pulses.

14 Claims, 5 Drawing Sheets

DATA OUTPUT CIRCUIT HAVING SHARED DATA OUTPUT CONTROL UNIT

TECHNICAL FIELD

This disclosure relates to a semiconductor memory device, and more particularly, to a data output circuit capable of reducing a chip size and current consumption in a semiconductor memory device.

BACKGROUND

Operation speed of semiconductor devices are continuously being improved through development of higher levels of integration. To improve the operation speed, synchronous memory devices which operate in synchronization with an external clock signal from an external circuit have been introduced.

The semiconductor memory device first introduced was a SDR (single data rate) synchronous memory device in which data are inputted and outputted through one data pin for one period of an external clock signal in synchronization with a rising edge of the external clock signal.

However, the SDR synchronous memory device is not sufficient for high-speed systems and therefore a DDR (double data rate) synchronous memory device which processes two data for one period of the external clock signal has been introduced.

In the DDR synchronous memory device, two data are inputted or outputted through a data pin in synchronization with rising and falling edges of the external clock signal. Accordingly, the DDR synchronous memory device has a bandwidth that is twice that of the SDR synchronous memory device, without increasing the clock frequency.

Figure 1:
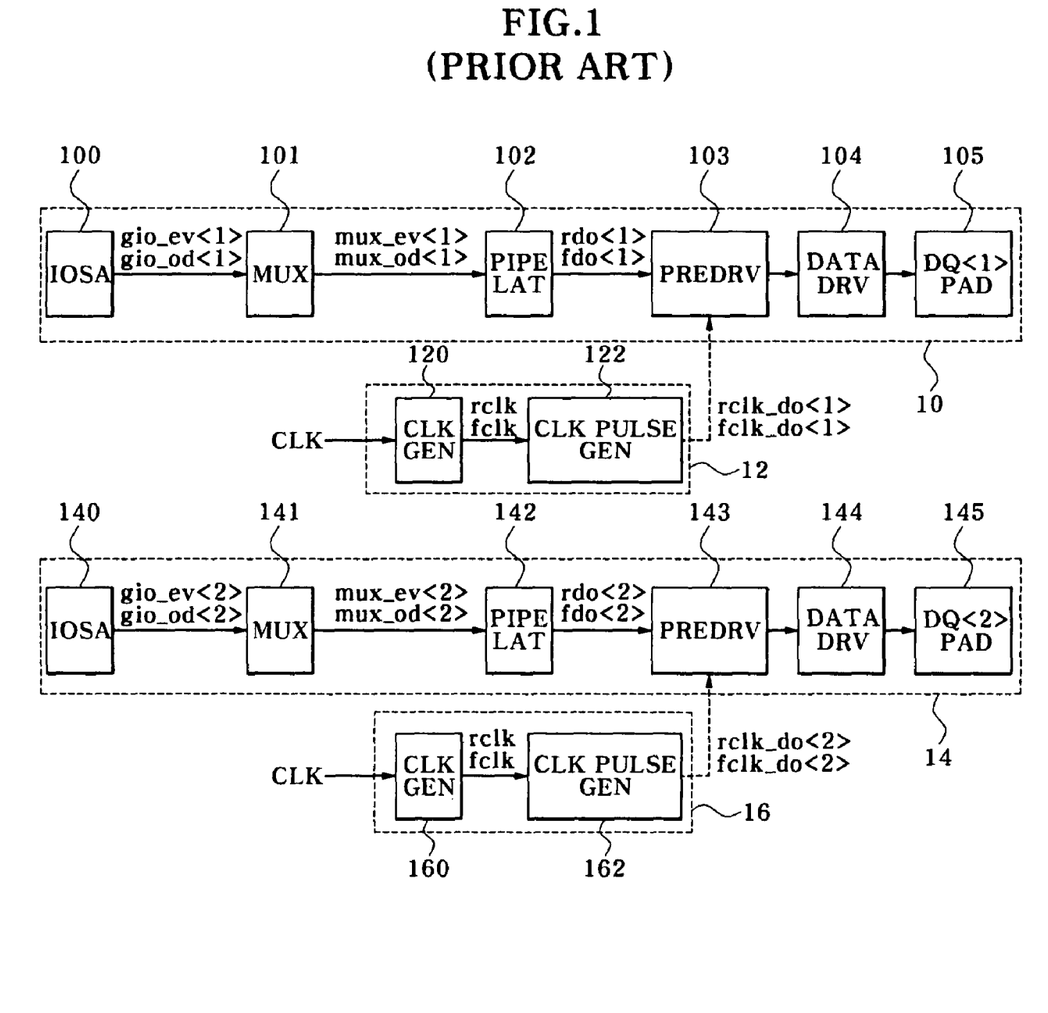
FIG. 1 is a block diagram illustrating a data output circuit of a conventional memory device.

FIG. 1 is a block diagram illustrating a data output circuit of a conventional memory device. Referring to FIG. 1, the conventional data output circuit includes a first data output unit 10, a first data output control unit 12, a second data output unit 14, and a second data output control unit 16.

The first data output unit 10 includes an I/O line sense amplifier 100, a multiplexer 101, a pipe latch 102, a pre-driver 103, a data driver 104, and a data pad 105. The I/O line sense amplifier 100 amplifies data transferred from a memory cell and then outputs even data gio_ev<1> and odd data gio_od<1>. The multiplexer 101 receives the even data gio_ev<1> and the odd data gio_od<1> and then produces even multiplexed data mux_ev<1> and odd multiplexed data mux_od<1> by multiplexing the received data based on the data width. The pipe latch 102 which receives the even multiplexed data mux_ev<1> and the odd multiplexed data mux_od<1> sequentially outputs rising data rdo<1> and falling data fdo<1>. The pre-driver 103 latches and outputs the rising data rdo<1> and the falling data fdo<1> in synchronization with a rising clock pulse rclk_do<1> and a falling clock pulse fclk_do<1>, respectively. The data driver 104 drives the data outputted from the pre-driver 103 in order to transfer the data to the data pad 105.

Here, the data width is the number of data which are outputted by one read command. Typically, the data width is X32, X16 and X8. In data width of X32, 32 data are simultaneously outputted.

The data output control unit 12 includes a clock signal generating unit 120 and a clock pulse generating unit 122.

The clock signal generating unit 120 receives an external clock signal CLK, and produces a rising clock signal rclk in synchronization with a rising edge of the external clock signal CLK and produces a falling clock signal fclk in synchronization with a falling edge of the external clock signal CLK.

The clock pulse generating unit 122 produces the rising clock pulse rclk_do<1> and the falling clock pulse fclk_do<1> by delaying the rising clock signal rclk and the falling clock signal fclk for a predetermined time in order to adjust output timing of the rising data rdo<1> and the falling data fdo<1>.

The second data output unit 14 includes an I/O line sense amplifier 140, a multiplexer 141, a pipe latch 142, a pre-driver 143, a data driver 144, and a data pad 145.

The I/O line sense amplifier 140 amplifies data transferred from a memory cell and outputs even data gio_ev<2> and odd data gio_od<2>.

The multiplexer 141 receives the even data gio_ev<2> and the odd data gio_od<2> and then produces even multiplexed data mux_ev<2> and odd multiplexed data mux_od<2> by multiplexing the received data based on the data width.

The pipe latch 142 which receives the even multiplexed data mux_ev<2> and the odd multiplexed data mux_od<2> sequentially outputs rising data rdo<2> and falling data fdo<2>.

The pre-driver 143 latches and outputs the rising data rdo<2> and the falling data fdo<2> in synchronization with a rising clock pulse rclk_do<2> and a falling clock pulse fclk_do<2>, respectively. The data driver 144 drives the data outputted from the pre-driver 143 in order to transfer the data to the data pad 145.

The second data output control unit 16 includes a clock signal generating unit 160 and a clock pulse generating unit 162.

The clock signal generating unit 160 which receives the external clock signal CLK produces a rising clock signal rclk in synchronization with a rising edge of the external clock signal CLK and produces a falling clock signal fclk in synchronization with a falling edge of the external clock signal CLK.

The clock pulse generating unit 162 produces the rising clock pulse rclk_do<2> and the falling clock pulse fclk_do<2> by delaying the rising clock signal rclk and the falling clock signal fclk for a predetermined time in order to adjust output timing of the rising data rdo<2> and the falling data fdo<2>.

As mentioned above, the conventional data output circuit includes the first data output control unit 12 to produce the first rising clock pulse rclk_do<1> and the first falling clock pulse fclk_do<1> in order to adjust the output timing of the data outputted from the first data output unit 10 and also includes the second data output control unit 16 to produce the second rising clock pulse rclk_do<2> and the second falling clock pulse fclk_do<2> in order to adjust the output timing of the data outputted from the second data output unit 14.

However, since the conventional data output circuit has a plurality of data output control units based on the number of data output units, the chip size is getting larger and larger with the increase of the output data and current consumption is also increased. Particularly, in case that the data width is X32, the increase of the size and current consumption imposes a burden on the semiconductor memory device design.

SUMMARY

In an aspect of this disclosure, a data output circuit is provided which is capable of reducing a size and current consumption by commonly using a data output control unit for a plurality of data output units.

In an exemplary embodiment, a data output circuit comprises a data output control unit for receiving an external clock signal and produce clock pulses having a pulse width, a first data output unit for outputting first data in synchronization with the clock pulses, and a second data output unit for outputting second data in synchronization with the clock pulses.

The data output control unit includes a clock signal generating unit for generating a clock signal having a pulse width using the external clock signal, and a clock pulse generating unit for generating the clock pulses by delaying the clock signal.

The clock signal includes a first clock signal generated in synchronization with a rising edge of the external clock signal, and a second clock signal generated in synchronization with a falling edge of the external clock.

The clock pulse includes a first clock pulse generated by delaying the first clock signal, and a second clock pulse generated by delaying the second clock signal.

The first data includes rising data and falling data.

The first data output unit includes a pre-driver for latching and outputting the rising data in synchronization with the first clock pulse and for latching and outputting the falling data in synchronization with the second clock pulse, and a data driver for driving the rising and falling data to a data pad.

The first data output unit further includes an I/O line sense amplifier for outputting even data and odd data by amplifying data transferred from a memory cell, a multiplexer for producing even multiplexed data and odd multiplexed data using the even data and the odd data, and a pipe latch for receiving the even multiplexed data and the odd multiplexed data and sequentially output the rising data and the falling data.

The second data include rising data and falling data.

The second data output unit includes a pre-driver for latching and outputting the rising data in synchronization with the first clock pulse and for latching and outputting the falling data in synchronization with the second clock pulse, and a data driver for driving the rising and falling data to a data pad.

The second data output unit further includes an I/O line sense amplifier for outputting even data and odd data by amplifying data transferred from a memory cell, a multiplexer for producing even multiplexed data and odd multiplexed data using the even data and the odd data, and a pipe latch for receiving the even multiplexed data and the odd multiplexed data and sequentially output the rising data and the falling data.

In another embodiment, a data output circuit comprises a data output control unit for receiving an external clock signal and produce first and second clock pulses having a pulse width, a first data output unit for outputting first data in synchronization with the first clock pulse, and a second data output unit for outputting second data in synchronization with the second clock pulse.

The data output control unit includes a clock signal generating unit for generating a clock signal having a pulse width using the external clock signal, a first clock pulse generating unit for generating the first clock pulse by delaying the clock signal, and a second clock pulse generating unit for generating the second clock pulse by delaying the clock signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, the present invention will be described in detail through examples and exemplary embodiments. The examples and exemplary embodiments merely exemplify the present invention, and the scope of this disclosure and the appended claims is not limited by them.

Figure 2:
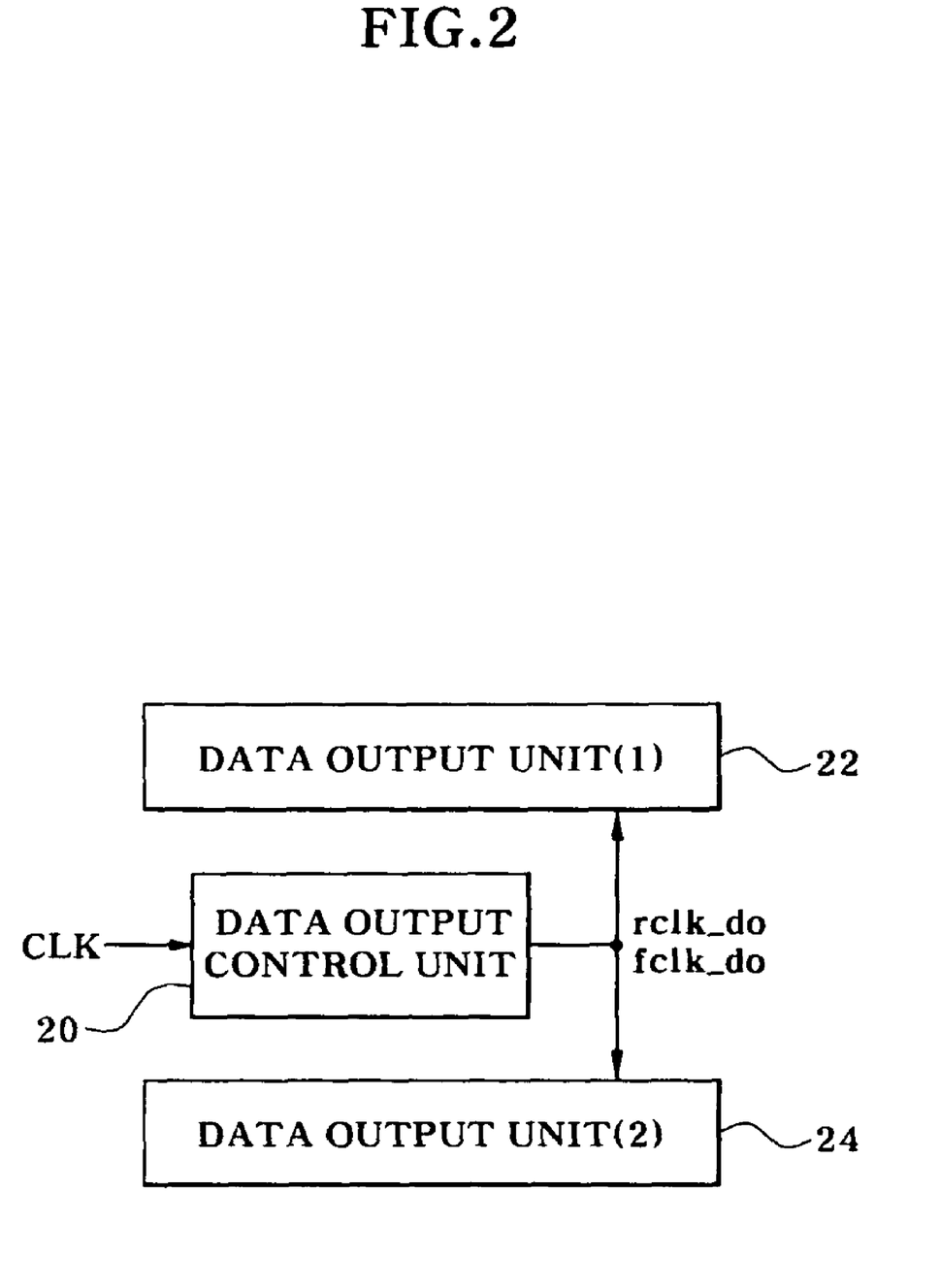
FIG. 2 is a block diagram illustrating a data output circuit according to an embodiment of this disclosure.
Figure 3:
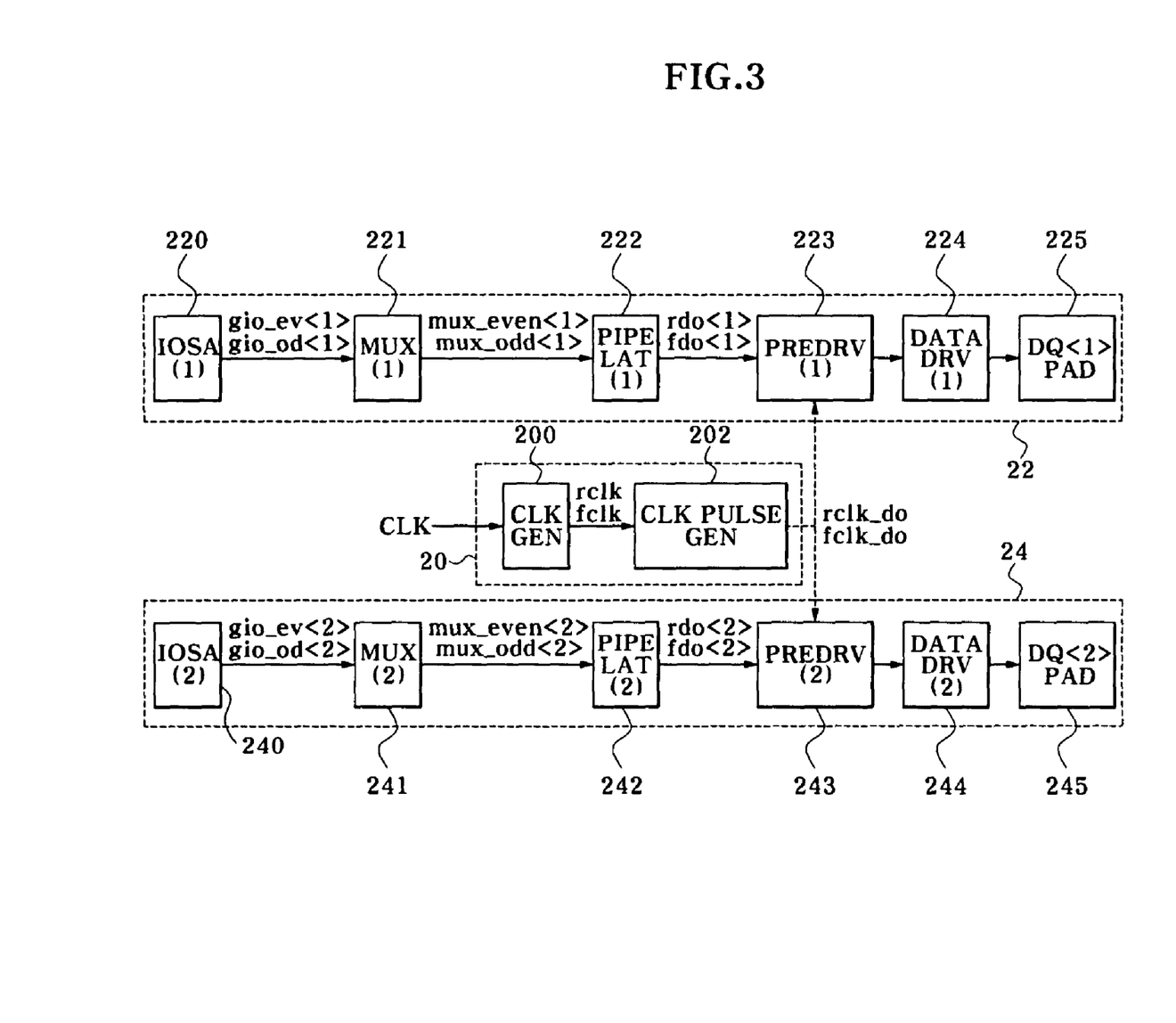
FIG. 3 is a circuit diagram for the data output circuit of FIG. 2.

FIG. 2 is a block diagram illustrating a data output circuit according to an embodiment of this disclosure and FIG. 3 is a circuit diagram for the data output circuit of FIG. 2.

Referring to FIG. 2, the data output circuit according to an embodiment of this disclosure includes a data output control unit 20 receiving an external clock signal CLK and then generate clock pulses rclk_do and fclk_do with a predetermined pulse width, a first data output unit 22 for outputting data in synchronization with the clock pulses rclk_do and fclk_do, and a second data output unit 24 for outputting the data in synchronization with the clock pulses rclk_do and fclk_do.

The data output circuit will be described in detail referring to FIG. 3.

First, the data output control unit 20 includes a clock signal generating unit 200 and a clock pulse generating unit 202.

The clock signal generating unit 200 receives the external clock signal CLK and then generates a rising clock signal rclk with the predetermined pulse width in synchronization with a rising edge of the click signal CLK and a falling clock signal fclk with the predetermined pulse width in synchronization with a falling edge of the click signal CLK.

The clock pulse generating unit 222 generates a rising clock pulse rclk_do and a falling clock pulse fclk_do in order to adjust the output timing of first and second rising data rdo<1:2> and the first and second falling data fdo<1:2>, by delaying the rising clock signal rclk and the falling clock signal fclk for a predetermined time.

Next, the first data output unit 22 includes a first I/O line sense amplifier 220, a first multiplexer 221, a first pipe latch 222, a first pre-driver 223, a first data driver 224, and a first data pad 225.

The first I/O line sense amplifier 220 outputs first even data gio_ev<1> and first odd data gio_od<1> by amplifying data transferred from a memory cell.

The first multiplexer 221 produces first even multiplexed data mux_ev<1> and first odd multiplexed data mux_od<1>, by receiving the first even data gio_ev<1> and the first odd data gio_od<1> and multiplexing them based on the data width of X32.

The first pipe latch 222 sequentially receives the first even multiplexed data mux_ev<1> and the first odd multiplexed data mux_od<1> and then outputs first rising data rdo<1> and first falling data fdo_<1> sequentially.

The first pre-driver 223 outputs first rising data rdo<1> in synchronization with the rising clock pulse rclk_do and outputs first falling data fdo<1> in synchronization with the falling clock pulse fclk_do.

The first data driver 224 transfers the data to the first data pad 225 the data by driving the data outputted from the first pre-driver 223.

Also, the second data output unit 24 includes a second I/O line sense amplifier 240, a second multiplexer 241, a second pipe latch 242, a second pre-driver 243, a second data driver 244, and a second data pad 245.

The second I/O line sense amplifier 240 outputs second even data gio_ev<2> and second odd data gio_od<1> by amplifying data transferred from a memory cell.

The second multiplexer 241 produces second even multiplexed data mux_ev<2> and second odd multiplexed data mux_od<2>, by receiving the second even data gio_ev<2> and the second odd data gio_od<2> and multiplexing them based on the data width of X32.

The second pipe latch 242 sequentially receives the second even multiplexed data mux_ev<1> and the second odd multiplexed data mux_od<2> and then outputs second rising data rdo<2> and second falling data fdo_<2> sequentially.

The second pre-driver 243 outputs the second rising data rdo<2> in synchronization with the rising clock pulse rclk_do and outputs the second falling data fdo<2> in synchronization with the falling clock pulse fclk_do.

The second data driver 244 transfers the data to the second data pad 245 by driving the data outputted from the second pre-driver 243.

The data output circuit according to the embodiment of FIGS. 2 and 3 is characterized in that the rising clock pulse rclk_do and the falling clock pulse fclk_do, which are generated by the data output control unit 20, are used in the second data output unit 24 as well as in the first data output unit 22. That is, the first data output unit 22 shares the data output control unit 20 with the second data output unit 24. By doing so, the first and second rising data rdo<1:2> are outputted in synchronization with the rising clock pulse rclk_do and the first and second falling data fdo<1:2> are outputted in synchronization with the falling clock pulse rclk_do. The size and current consumption can be reduced by sharing the data output control unit amongst the plurality of data output units.

Although one data output control unit for two data output units is illustrated in this exemplary embodiment, a plurality of data output unit can share one data output control unit in other embodiments.

Figure 4:
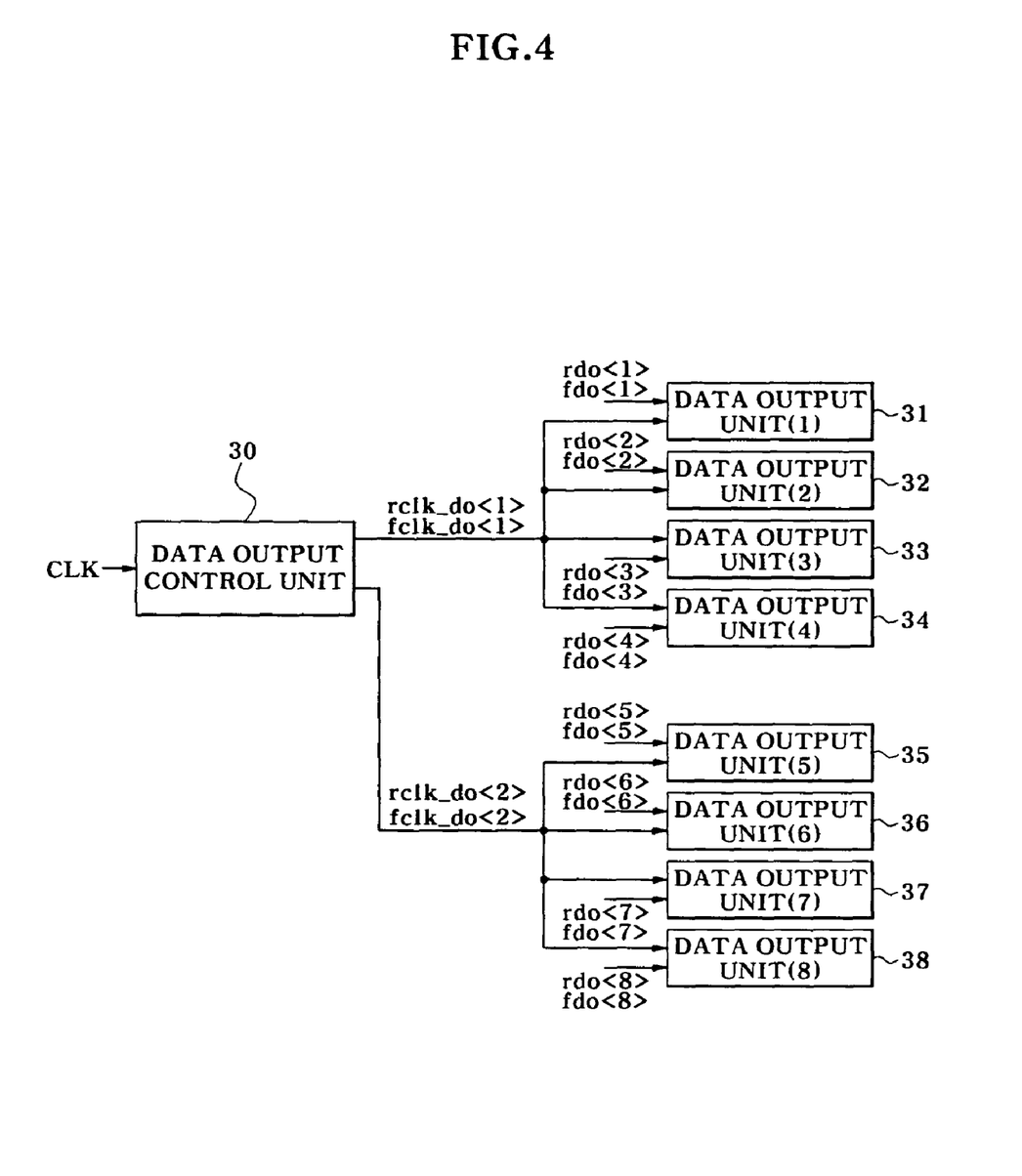
FIG. 4 is a block diagram illustrating a data output unit according to another embodiment of this disclosure.
Figure 5:
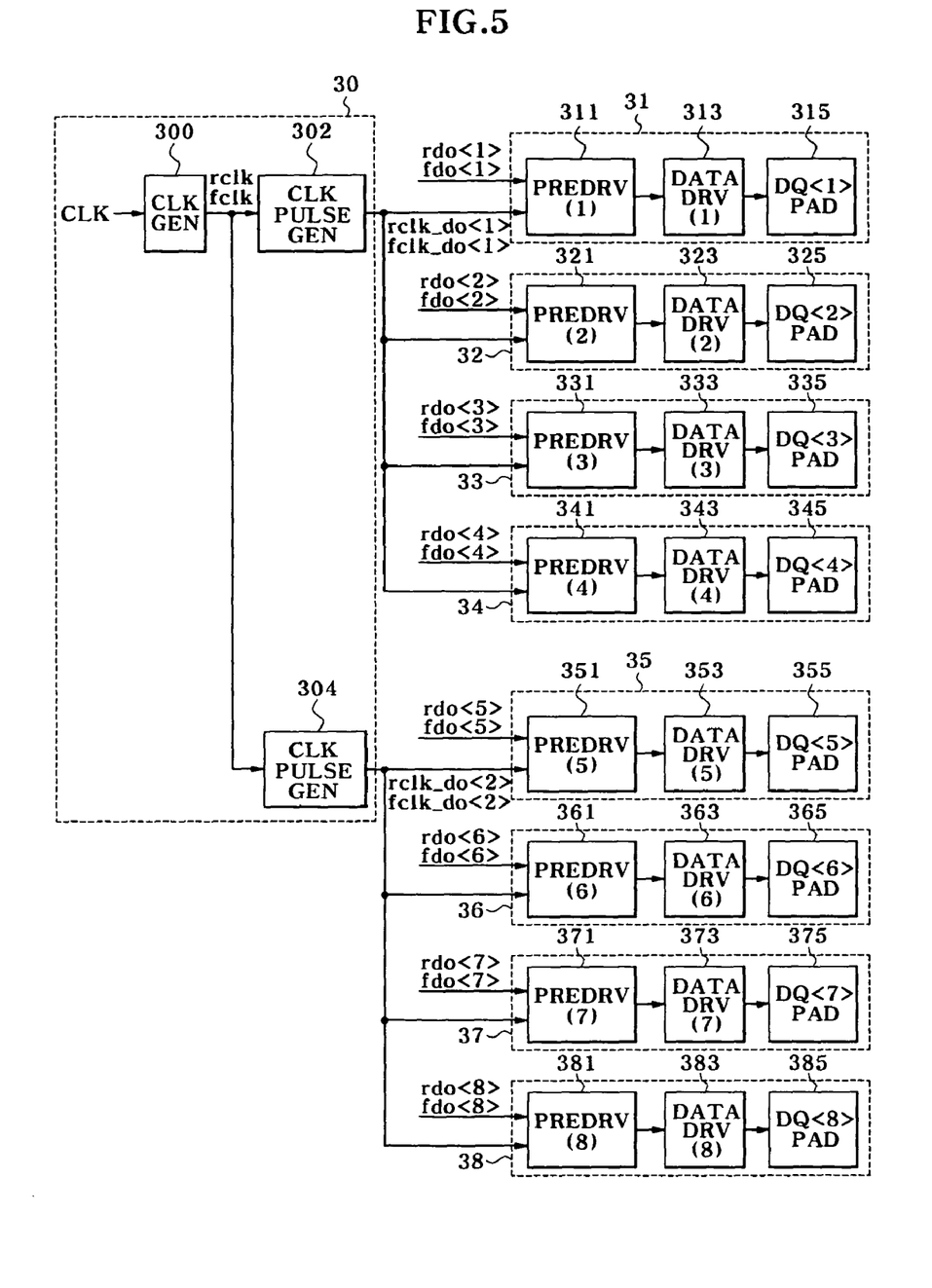
FIG. 5 is a detailed block diagram for the data output unit of FIG. 4.

FIG. 4 is a block diagram illustrating a data output circuit according to another embodiment of this disclosure and FIG. 5 is a detailed block diagram for the data output circuit of FIG. 4.

Referring to FIG. 4, the data output circuit according to the another embodiment of this disclosure includes a data output control unit 30 to receive an external clock signal CLK for generating clock pulses rclk_do<1:2> and fclk_do<1:2>, first to fourth data output units 31 to 34 for outputting data in synchronization with the clock pulses rclk_do<1> and fclk_do<1>, and fifth to eighth data output units 35 to 38 for outputting data in synchronization with the clock pulses rclk_do<2> and fclk_do<2>.

The data output circuit according to the another embodiment of this disclosure will be described in detail referring to FIG. 5.

First, the data output control unit 30 includes a clock signal generating unit 300, a first clock pulse generating unit 302, and a second clock pulse generating unit 304.

The clock signal generating unit 300 generates a rising clock signal rclk having a predetermined pulse width in synchronization with a rising edge of the external clock signal CLK and generates a falling clock signal fclk having a predetermined pulse width in synchronization with a falling edge of the external clock signal CLK.

The first clock pulse generating unit 302 generates a first rising clock pulse rclk_do<1> and a first falling clock pulse fclk_do<1> in order to adjust the output timing of first to fourth rising data rdo<1:4> and first to fourth falling data fdo<1:4>, by delaying the rising clock signal rclk and the falling clock signal fclk for a predetermined time.

The second clock pulse generating unit 304 generates a second rising clock pulse rclk_do<2> and a second falling clock pulse fclk_do<2> in order to adjust the output timing of fifth to eighth rising data rdo<5:8> and fifth to eighth falling data fdo<5:8>, by delaying the rising clock signal rclk and the falling clock signal fclk for a predetermined time.

The first data output unit 31 includes a first pre-driver 311, a first data driver 313 and a first data pad 315.

The first pre-driver 311 outputs first rising data rdo<1> in synchronization with the first rising clock pulse rclk_do<1> and outputs first falling data fdo<1> in synchronization with the first falling clock pulse fclk_do<1>. The first data driver 313 transfers the data to the first data pad 315 by driving the data outputted from the first pre-driver 311.

Next, the second data output unit 32 includes a second pre-driver 321, a second data driver 323 and a second data pad 325.

The second pre-driver 321 outputs second rising data rdo<2> in synchronization with the first rising clock pulse rclk_do<1> and outputs second falling data fdo<2> in synchronization with the first falling clock pulse fclk_do<1>. The second data driver 323 transfers the data to the second data pad 325 by driving the data outputted from the second pre-driver 321.

Next, the third data output unit 33 includes a third pre-driver 331, a third data driver 333 and a third data pad 335.

The third pre-driver 331 outputs third rising data rdo<3> in synchronization with the first rising clock pulse rclk_do<1> and outputs third falling data fdo<3> in synchronization with the first falling clock pulse fclk_do<1>. The third data driver 333 transfers the data to the third data pad 335 by driving the data outputted from the third pre-driver 331.

The fourth data output unit 34 includes a fourth pre-driver 341, a fourth data driver 343 and a fourth data pad 345.

The fourth pre-driver 341 outputs fourth rising data rdo<4> in synchronization with the first rising clock pulse rclk_do<1> and outputs fourth falling data fdo<4> in synchronization with the first falling clock pulse fclk_do<1>. The fourth data driver 343 transfers the data to the fourth data pad 345 by driving the data outputted from the fourth pre-driver 341.

The fifth data output unit 35 includes a fifth pre-driver 351, a fifth data driver 353 and a fifth data pad 355.

The fifth pre-driver 351 outputs fifth rising data rdo<5> in synchronization with the second rising clock pulse rclk_do<2> and outputs fifth falling data fdo<5> in synchronization with the second falling clock pulse fclk_do<2>. The fifth data driver 353 transfers the data to the fifth data pad 355 by driving the data outputted from the fifth pre-driver 351.

The sixth data output unit 36 includes a sixth pre-driver 361, a sixth data driver 363 and a sixth data pad 365.

The sixth pre-driver 361 outputs sixth rising data rdo<6> in synchronization with the second rising clock pulse rclk_do<2> and outputs sixth falling data fdo<5> in synchronization with the second falling clock pulse fclk_do<2>. The sixth data driver 363 transfers the data to the sixth data pad 365 by driving the data outputted from the sixth pre-driver 361.

The seventh data output unit 37 includes a seventh pre-driver 371, a seventh data driver 373 and a seventh data pad 375.

The seventh pre-driver 371 outputs seventh rising data rdo<7> in synchronization with the second rising clock pulse rclk_do<2> and outputs seventh falling data fdo<7> in synchronization with the second falling clock pulse fclk_do<2>. The seventh data driver 373 transfers the data to the seventh data pad 375 by driving the data outputted from the seventh pre-driver 371.

The eighth data output unit 38 includes an eighth pre-driver 381, an eighth data driver 383 and an eighth data pad 385.

The eighth pre-driver 381 outputs eighth rising data rdo<8> in synchronization with the second rising clock pulse rclk_do<2> and outputs the eighth falling data fdo<8> in synchronization with the second falling clock pulse fclk_do<2>. The eighth data driver 383 transfers the data to the eighth data pad 385 by driving the data outputted from the eighth pre-driver 381.

In the another embodiment of FIGS. 4 and 5, both the first rising clock pulse rclk_do<1> and the first falling clock pulse fclk_do<1>, which are generated by the data output control unit 30, are used in the first to fourth data output units 31 to 34. Also, both the second rising clock pulse rclk_do<2> and the second falling clock pulse fclk_do<2>, which are generated by the data output control unit 30, are used in the fifth to eighth data output units 35 to 38. That is, the data output control unit 30 is commonly used in the first to eighth data output units 31 to 38. Accordingly, the first to fourth rising data rdo<1:4> are outputted in synchronization with the first rising clock pulse rclk_do<1>, the first to fourth falling data fdo<1:4> are outputted in synchronization with the first falling clock pulse fclk_do<1>, the fifth to eighth rising data rdo<5:8> are outputted in synchronization with the second rising clock pulse rclk_do<2>, and the fifth to eighth falling data fdo<5:8> are outputted in synchronization with the second falling clock pulse fclk_do<2>. As mentioned above, because the data output control unit is commonly used in the plurality of data output units, the size and current consumption can be reduced.

While the present invention has been described with respect to particular examples and exemplary embodiments, it will be apparent to those skilled in the art that various changes and modifications may be made without departing from the spirit and scope of this disclosure and the following claims. For example, in the example of FIGS. 4 and 5, eight data output units corresponding to one data output control unit are illustrated, but the number of data output units can be changed based on a data output structure This disclosure claims priority to Korean application number 10-2008-0024578, filed on Mar. 17, 2008, the entire contents of which are incorporated herein by reference.

What is claimed is:

1. A data output circuit comprising:
   a data output control unit configured to receive an external clock signal and generate a first clock pulse and a second clock pulse;
   a first pre-driver for latching and outputting a first rising data in synchronization with the first clock pulse and for latching and outputting a first falling data in synchronization with the second clock pulse; and
   a second pre-driver for latching and outputting a second rising data in synchronization with the first clock pulse and for latching and outputting a second falling data in synchronization with the second clock pulse.

2. The data output circuit of claim 1, wherein the data output control unit includes:
   a clock signal generating unit for generating a first clock signal and a second clock signal using the external clock signal; and
   a clock pulse generating unit for generating the first clock pulse and the second clock pulse by delaying the first clock signal and the second clock signal.

3. The data output circuit of claim 2, wherein the first clock signal is generated in synchronization with a rising edge of the external clock signal, the second clock signal is generated in synchronization with a falling edge of the external clock.

4. The data output circuit of claim 1,
   further comprising a data driver for driving the data outputted from the first pre-driver and transferring the data to a data pad.

5. The data output circuit of claim 4 further comprising:
   an I/O line sense amplifier for outputting even data and odd data by amplifying data transferred from a memory cell;
   a multiplexer for producing even multiplexed data and odd multiplexed data using the even data and the odd data; and
   a pipe latch for receiving the even multiplexed data and the odd multiplexed data and sequentially output the first rising data and the first falling data.

6. The data output circuit of claim 1, further comprising a data driver for driving the data outputted from the second pre-driver and transferring the data to a data pad.

7. The data output circuit of claim 6 further comprising:
   an I/O line sense amplifier for outputting even data and odd data by amplifying data transferred from a memory cell;
   a multiplexer for producing even multiplexed data and odd multiplexed data using the even data and the odd data; and
   a pipe latch for receiving the even multiplexed data and the odd multiplexed data and sequentially output the second rising data and the second falling data.

8. A data output circuit comprising:
   a data output control unit configured to receive an external clock signal and generate first to fourth clock pulses;
   a first pre-driver for latching and outputting a first rising data in synchronization with the first clock pulse and for latching and outputting a first falling data in synchronization with the second clock pulse;
   a second pre-driver for latching and outputting a second rising data in synchronization with the first clock pulse and for latching and outputting a second falling data in synchronization with the second clock pulse;
   a third pre-driver for latching and outputting a third rising data in synchronization with the third clock pulse and for latching and outputting a third falling data in synchronization with the fourth clock pulse; and
   a fourth pre-driver for latching and outputting a fourth rising data in synchronization with the third clock pulse and for latching and outputting a fourth falling data in synchronization with the fourth clock pulse.

9. The data output circuit of claim 8, wherein the data output control unit includes:
   a clock signal generating unit configured to generate first to fourth clock signals using the external clock signal;
   a first clock pulse generating unit for generating the first and second clock pulses by delaying the first and second clock signals; and
   a second clock pulse generating unit for generating the third and fourth clock pulses by delaying the third and fourth clock signals.

10. The data output circuit of claim 9, wherein the first and third clock signals are generated in synchronization with a rising edge of the external clock signal; and the second and fourth clock signals are generated in synchronization with a falling edge of the external clock signal.

11. The data output circuit of claim 8, further comprising a data driver for driving the data outputted from the first pre-driver and transferring the data to a data pad.

12. The data output circuit of claim 8, further comprising a data driver for driving the data outputted from the second pre-driver and transferring the data to a data pad.

13. The data output circuit of claim 8, further comprising a data driver for driving the data outputted from the third pre-driver and transferring the data to a data pad.

14. The data output circuit of claim 8, further comprising a data driver for driving the data outputted from the fourth pre-driver and transferring the data to a data pad.

* * * * *